United States Patent [19]

Kerth

[11] Patent Number: 4,748,418
[45] Date of Patent: May 31, 1988

[54] QUASI AUTO-ZERO CIRCUIT FOR SAMPLING AMPLIFIERS

[75] Inventor: Donald A. Kerth, Austin, Tex.

[73] Assignee: Crystal Semiconductor Corporation, Austin, Tex.

[21] Appl. No.: 929,984

[22] Filed: Nov. 12, 1986

[51] Int. Cl.⁴ .......................... H03F 1/00; H03K 5/22
[52] U.S. Cl. ......................................... 330/9; 307/362
[58] Field of Search .................... 330/9; 307/355, 356, 307/362

[56] References Cited

U.S. PATENT DOCUMENTS 4,547,683 10/1985 Bingham .............................. 307/355

OTHER PUBLICATIONS

Tsukada, et al., "CMOS 8b 25MHz Flash ADC," Proceedings of the 1985 IEEE International Solid-State Circuits Conferences, pp. 34 and 35.

Kansy, "Response of a Correlated Double Sampling Circuit to 1/f Noise," IEEE Journal of Solid-State Circuits, vol. SC-15, Number 3, Jun. 1980, pp. 373-375.

Primary Examiner—James B. Mullins
Attorney, Agent, or Firm—Leonard & Lott

[57] ABSTRACT

A sampling amplifier (22) consisting of a series combination of a signal input terminal (12), a first capacitor (C1), a first amplifier (A1), a second capacitor (C2), a second amplifier (A2), and a signal output terminal (VOUT2) is able to sample at a higher frequency by providing a low impedance path between the signal output terminal (VOUT2) and a junction (VOUT1) between the first amplifier (A1) and the second capacitor (C2) to quasi auto-zero the amplifier between samples.

3 Claims, 2 Drawing Sheets

QUASI AUTO-ZERO CIRCUIT FOR SAMPLING AMPLIFIERS

TECHNICAL FIELD

This invention relates to electronic amplifiers, and more particularly to sampling electronic amplifiers.

BACKGROUND OF THE INVENTION

Sampling amplifiers are used in a number of applications, one of which is as a clocked comparator. In a typical type of such circuit a reference voltage is applied to the input of the amplifier, and capacitors inside the amplifier are allowed to charge to a level to preferably bias the amplifier to a high-gain point on the amplifier transfer characteristics, with the amplifier's output voltage at a voltage between the supply voltage levels. When the reference voltage is replaced by an unknown voltage, the voltage difference between the unknown voltage and the reference voltage is amplified and the output voltage usually is pulled toward one of the supply voltages by the amplifier. Circuits of this type are well known in the art and are described in various articles including Tsukada, Toshiro et al, "CMOS 8b 25 MHz Flash ADC", Proceedings of the 1985 IEEE International Solid-State Circuits Conference, pp 34,35; and Kansy, Robert J., "Response of a Correlated Double Sampling Circuit to 1/f Noise", IEEE Journal of Solid-State Circuits, Vol. SC-15, No. 3, June 1980, pp 373–375.

Comparator circuits of this type are very useful in CMOS flash analog-to-digital (A/D) converter circuits because of their simplicity and response time. Such a comparator circuit may include the series combination of a first series capacitor, a first amplifier, a second series capacitor and a second amplifier plus various switches and reference voltages to precondition the series capacitors during a reset operation of the comparator. Such a comparator operates by first being reset or "zeroed" to set a proper charge on the capacitors, and then by being connected to the unknown input voltage.

A significant limitation of prior art A/D converter circuits described in the previous paragraph is that the reset operation is usually repeated between every sample even though the charge on the capacitors, set by the previous reset operation, is still correct for the next and many more sampling operations, that is, until the charge leakage from the capacitors would require another reset operation. The reason for performing the reset between each sample is to quickly return the amplifier back into its narrow active range of operation after the sample and comparison operation pulls the output of the amplifier toward one of the supply voltages. In other words, if at least significant bit input signal is applied after the amplifier has had its output driven to one of the supply voltages, the time required for the amplifier to recover and provide an accurate output would be excessively long if a reset operation were not performed. Since the reset operation takes at least long enough for the amplifier to return to is settled active region, and then for the capacitors to settle out, the periodic sample rate must be sufficiently long to include a reset operation in addition to the actual sample and comparison operation.

Therefore it can be appreciated that a circuit which would provide a faster zeroing operation between samples of a sampling comparator is highly desirable.

SUMMARY OF THE INVENTION

It is therefore an object of this invention to provide a method and circuit to more quickly reset or zero a sampling comparator between samples.

As shown in a illustrated embodiment of the invention, a quasi auto-zero circuit according to the present invention includes a series combination of a signal input terminal, a first capacitor, a first inverting amplifier, a second capacitor, a second inverting amplifier and a signal output terminal. The quasi auto-zero operation is accomplished by providing a low impedance between the signal output terminal and a junction between the first amplifier and the second capacitor.

BRIEF DESCRIPTION OF THE DRAWINGS

The aforementioned and other features, characteristics, advantages, and the invention in general, will be better understood from the following more detailed description taken in conjunction with the accompanying drawings in which.

Figure 1A:
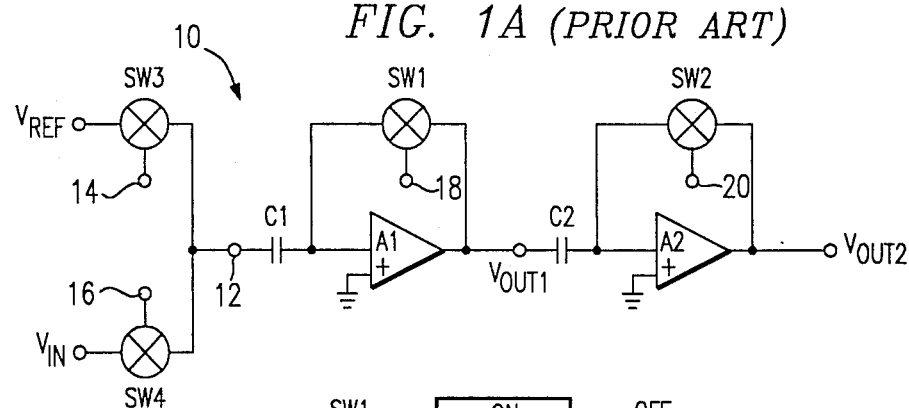
FIG. 1A is a schematic diagram of a prior art sampling comparator circuit.

It will be appreciated that, where considered appropriate, reference numerals and letters have been repeated in the figures to indicate corresponding features.

DESCRIPTION OF THE PREFERRED EMBODIMENTS

A prior art comparator circuit is shown as element 10 in FIG. 1A. A reference voltage input terminal, VREF, is connected to one signal terminal of a switch, SW3, the other signal terminal of which is connected to a node 12. Switch SW3 is controlled by the voltage at a control terminal, 14, of switch SW3. An unknown voltage input terminal, VIN, is connected to one signal terminal of a another switch, SW4, the other terminal of which is connected to node 12. Switch SW4 is controlled by the voltage at a control terminal, 16, of swich SW4. Node 12 is also referred to herein as a signal input terminal.

Also connected to node 12 is one terminal of a capacitor, C1, the other terminal of which is connected to the inverting input of a differential amplifier, A1, and to a signal terminal of a switch, SW1. The noninverting input of the amplifier A1 is connected to ground. The other signal terminal of switch SW1 is connected to the output terminal of amplifier A1 at a node, VOUT1. Switch SW1 is controlled by the voltage at a control terminal, 18, of switch SW1. Node VOUT1 is connected to one terminal of another capacitor, C2, the other terminal of which is connected to the inverting input of another differential amplifier, A2, and to a signal terminal of another switch, SW2. The noninverting input of the amplifier A2 is connected to ground. The other signal terminal of switch SW2 is connected to the output terminal of amplifier A2 at a node, VOUT2. Switch SW2 is controlled by the voltage at a control terminal, 20, of switch SW2.

Figure 1B:
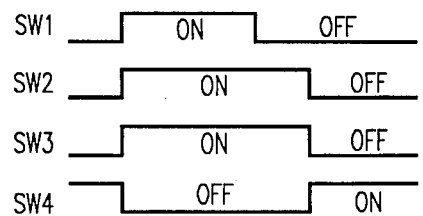
FIG. 1B is a timing diagram for use in conjunction with the circuit of FIG. 1A.

The operation of the circuit of FIG. 1A will be described in conjunction with FIG. 1B. Prior to a comparison operation, the circuit 10 is reset by turning on switches SW1, SW2 and SW3, and by turning off switch SW4. As used herein, a switch is "on" when it provides a low impedance path between its two signal terminals, and is "off" when it provides a high impedance between the signal terminals. Under these conditions the reference voltage at VREF is connected to node 12, and amplifiers A1 and A2 each has its inverting input connected to its output. This condition is held long enough so that capacitor C1 is charged to a voltage VREF-VOS1 and capacitor C2 is charged to a voltage VOS1-VOS2, where VOS1 and VOS2 are the offset voltages for amplifiers A1 and A2 respectively. When the comparison is to be performed, the switch SW1 is first turned off, and after a suitable delay, the switches SW2 and SW3 are switched off and switch SW4 is switched on. If there were no charge injection into the circuit from the switches SW1 and SW2, and if the capacitors C1 and C2 were properly precharged to reduce the effects of the amplifier offset voltages, then the output VOUT2 will swing toward the appropriate supply voltage level if the unknown voltage at VIN is greater than the difference between the reference voltage and the circuit's overall input-related offset voltage.

In practice, however, capacitive coupling and channel charge from the switches SW1 and SW2 allows charge to be injected into the circuit 10 when switches SW1 and SW2 are turned off. Moreover, the voltage change which is caused by charge injected from switch SW1 to the input of amplifier A1 is amplified by amplifier A1. The charge effects of switch SW1 are lessened by the turning off of switch SW1 before switch SW2 is turned off. This is shown in FIG. 1B by the delay between the turning off of switch SW1 and switch SW2.

The voltages appearing at nodes VOUT1 and VOUT2 during the reset operation after the switches SW1 and SW2 are turned off in succession are approximately $$VOUT1(AZ) = VOS1 + (A1)(Vft1) \quad (1)$$

$$VOUT2(AZ) = VOS2 + (A2)(Vft2) \quad (2)$$

where
VOUT1 (AZ) is the voltage at node VOUT1 under reset or auto-zero conditions;
VOUT2 (AZ) is the voltage at node VOUT2 under reset or auto-zero conditions;
VOS1 is the offset voltage of amplifier A1;
VOS2 is the offset voltage of amplifier A2;
A1 is the gain of amplifier A1;
A2 is the gain of amplifier A2;
Vft1 is switch SW1 charge injection voltage;
Vft2 is switch SW2 charge injection voltage;
and $$VC2 = (VOS1 - VOS2) + [(A1)(Vft1) - Vft2] \quad (3)$$

where VC2 is the voltage across capacitor C2.

As discussed in the Background of the Invention section above, during each sample operation the output of the sampling comparator 10 is pulled toward one of the supply voltages. Since the time for the amplifier to recover is relatively long if the unknown input voltage is close to the reference voltage, VREF, the prior art practice is to perform a full reset operation between each sample, thus significantly increasing the sample period.

Figure 2:
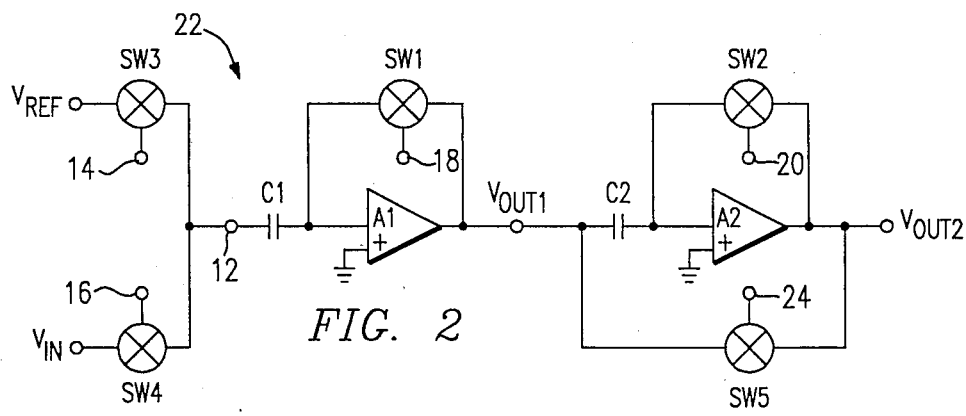
FIG. 2 is a schematic diagram of a sampling comparator circuit which incorporates the quasi auto-zero circuit of the present invention.

Turning now to the circuit of FIG. 2, shown generally as element 22, the previously described prior art sampling comparator is enhanced by the addition of another switch, SW5, which is connected between node VOUT1 and node VOUT2. Switch SW5 is controlled by the voltage at a control terminal, 24, of switch SW5. In operation, after a reset as described above ("full reset") has been accomplished and capacitors C1 and C2 have been properly biased, and after the first sample has been accomplished and the output of the sampling comparator is generally at one or the other of the supply voltages, the sampling comparator can be quasi reset or quasi auto-zeroed by simply turning switch SW5 on without turning on either switch SW1 or SW2.

When switch SW5 is turned on, the voltages appearing at nodes VOUT1 and VOUT2 are given by the following equation:

$$VOUT1(QAZ) = VOUT2(QAZ) = VOS2 + VC2 \quad (4)$$

Substituting equation (3) into equation (4) gives $$VOUT1(QAZ) = VOUT2(QAZ) = VOS1 + (A1)(Vft1) - (Vft2) \quad (5)$$

and with A1>>1

$$VOUT1(QAZ) = VOUT2(QAZ) = VOS1 + (A1)(Vft1) \quad (6)$$

where
VOUT1(QAZ) is the voltage at node VOUT1 under quasi reset or quasi auto-zero conditions; and
VOUT2(QAZ) is the voltage at node VOUT2 under quasi reset or quasi auto-zero conditions.
If VOS1=VOS2 and (A1)(Vft1)=(A2) (Vft2), then $$VOUT1(QAZ) = VOUT2(QAZ) = VOUT1(AZ) = VOUT2(AZ) \quad (7)$$

Or, in other words, by properly choosing amplifiers which have matched offsets and choosing amplifiers and switches such that the feedthrough voltage products are approximately the same for both amplifiers and switches, the sampling comparator will be reset as though it has gone through a full reset cycle by simply turning on switch SW5.

Advantageously, the quasi auto-zero operation does not alter the voltages across capacitors C1 and C2, and therefore it is not necessary to wait for voltages across these capacitors to settle out. Accordingly the quasi auto-zero can be performed much more quickly than a full reset operation. As a result, the sampling frequency can be correspondingly increased.

However, since the quasi auto-zero operation does not affect the charge on capacitors C1 and C2, a full reset must initially be performed, and then periodically thereafter to replace any charge on the capacitors which has leaked off. When the circuit is embodied in an integrated circuit, for example, charge may leak off due to pn junction leakage currents. However, in MOS monolithic integrated circuits the ratio of time required between full resets compared to the time for each sample is typically in the range of two orders of magnitude.

Figure 3:
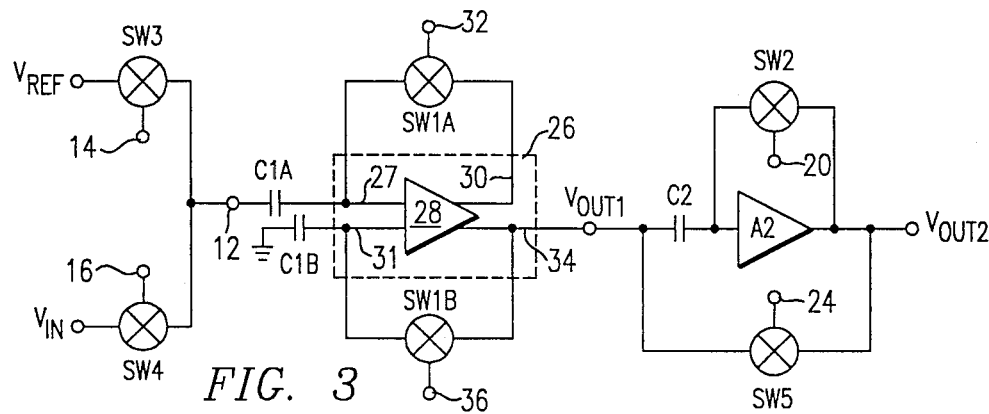
FIG. 3 is a more detailed schematic diagram of the preferred embodiment of the comparator circuit of FIG. 2.

In an alternative preferred embodiment of the invention, the amplifier A1 may be arranged as shown generally as element 26 in FIG. 3. In FIG. 3, node 12 is connected to one terminal of a capacitor C1A the other terminal of which is connected to a first input, 27, of a differential amplifier, 28, and to a signal terminal of a switch, SW1A, the other signal terminal of which is connected to a first output terminal, 30, of differential amplifier 28. The first output terminal 30 is inverted with respect to the first input 27. Switch SW1A is controlled by the voltage at a control terminal, 32, of switch SW1A. A second input terminal, 31, of differential amplifier 28 is connected to one terminal of a capacitor, C1B, the other terminal of which is connected to ground. The second input terminal 31 of differential amplifier 28 is also connected to a signal terminal of a switch, SW1B, the other signal terminal of which is connected to a second output terminal, 34, of differential amplifier 28. The second output terminal 34 is inverted with respect to the second input 31, but is noninverted with respect to the first input 27. In the preferred embodiment, the gain from terminal 27 to terminal 30 is relatively low compared to the gain from terminals 27 or 31 to terminal 34. Switch SW1B is controlled by the voltage at a control terminal, 36, of switch SW1B. The second output terminal 34 is connected to the capacitor C2. In all other respects FIG. 3 is the same as FIG. 2.

In operation, switches SW1A and SW1B are controlled by the same signal and thus operate simultaneously. This action produces the same reset action as described above with respect to FIG. 1. Advantageously, the common mode rejection characteristics of the differential amplifier 28 helps suppress the charge injection effects from switches SW1A and SW1B.

Although the invention has been described in part by making detailed reference to a certain specific embodiment, such detail is intended to be and will be understood to be instructional rather than restrictive. It will be appreciated by those skilled in the art that many variations may be made in the structure and mode of operation without departing from the spirit and scope of the invention, as disclosed in the teachings contained herein. For example, the differential amplifiers may be replaced by other types of amplifiers, including simple inverters.

What is claimed is:

1. Apparatus for sampling and amplifying an input voltage comprising:
   (a) a signal input terminal;
   (b) a first series capacitor having a first terminal thereof coupled to said signal input terminal;
   (c) a first amplifier having an input terminal thereof coupled to a second terminal of said first capacitor;
   (d) a first switching means coupled between said input terminal of said first amplifier and an output terminal of said first amplifier for providing either a low impedance between said input and said output terminals of said first amplifier or a high impedance between said input and said output terminals of said first amplifier in response to a first switch control signal;
   (e) a second series capacitor having a first terminal thereof coupled to said output terminal of said first amplifier;
   (f) a second amplifier having an input terminal thereof coupled to a second terminal of said second capacitor;
   (g) a second switching means coupled between said input terminal of said second amplifier and an output terminal of said second amplifier for providing either a low impedance between said input and said output terminals of said second amplifier or a high impedance between said input and said output terminals of said second amplifier in response to a second switch control signal;
   (h) a third switching means coupled between said output terminal of said first amplifier and said output terminal of said second amplifier for providing either a low impedance between said output terminal of said first amplifier and said output terminal of said second amplifier or a high impedance between said output terminal of said first amplifier and said output terminal of said second amplifier in response to a third switch control signal;
   (i) a signal output terminal coupled to said output terminal of said second amplifier;
   (j) during an initial full reset operation and during periodic full resets thereafter said first and second switch control signals are in a first state which provides a low impedance in said first and second switching means respectively, the time interval between said full resets being substantially longer than the fastest sampling periods of said apparatus; and
   (k) between each sampling operation of said apparatus, other than during said full resets, said third switch control signal is in a first state which provides a low impedance in said third switching means.

2. A method of resetting a sampling amplifier between each sampling period of a plurality of successive sampling periods in a predetermined time interval, said plurality of sampling periods being less than the total of the sampling periods in said predetermined time interval, said sampling amplifier including a series combination of a signal input terminal, a first series capacitor, a first amplifier, a second series capacitor, a second amplifier and a signal output terminal, comprising:
providing a low impedance path between said signal output terminal and a signal node between said first amplifier and said second capacitor at a time between each of said plurality of sampling periods, and wherein a high impedance is provided between said signal output terminal and said signal node between said first amplifier and said second capacitor during the entire time between at least two successive sampling periods occurring in said predetermined time interval.

3. In a sampling amplifier which is reset between each sampling operation and which comprises a series combination of a signal input terminal, a first series capacitor, a first amplifier having a first switching means coupled between its output terminal and its input terminal, a second series capacitor, and a second amplifier having a second switching means coupled between its output terminal and its input terminal; the improvement comprising placing said first and second switching means in a first state to provide a low impedance between said output terminals and said input terminals of said first and second amplifiers respectively at a time between two successive sampling periods, and placing said first and second switching means in a second state to provide a high impedance between said output terminals and said input terminals of said first and second amplifiers respectively continuously during the time interval encompassing a plurality of successive sampling periods.

* * * * *